United States Patent
Daimon

(10) Patent No.: US 12,424,997 B2
(45) Date of Patent: Sep. 23, 2025

(54) ACOUSTIC WAVE DEVICE AND LADDER FILTER

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 245 days.

(21) Appl. No.: 18/200,013

(22) Filed: May 22, 2023

(65) Prior Publication Data

US 2023/0308071 A1 Sep. 28, 2023

Related U.S. Application Data

(63) Continuation of application No. PCT/JP2022/005638, filed on Feb. 14, 2022.

(30) Foreign Application Priority Data

Feb. 15, 2021 (JP) ................ 2021-021850

(51) Int. Cl.
| | | |
|---|---|---|
| H03H 9/02 | (2006.01) | |
| H03H 9/17 | (2006.01) | |
| H03H 9/58 | (2006.01) | |
| H03H 9/60 | (2006.01) | |

(52) U.S. Cl.
CPC .... *H03H 9/02031* (2013.01); *H03H 9/02157* (2013.01); *H03H 9/171* (2013.01); *H03H 9/582* (2013.01); *H03H 9/605* (2013.01)

(58) Field of Classification Search
CPC ........... H03H 9/02031; H03H 9/02157; H03H 9/171; H03H 9/582; H03H 9/605; H03H 9/02559; H03H 9/02834; H03H 9/14541; H03H 9/6483; H03H 9/02574
USPC .................................. 333/193–196
See application file for complete search history.

(56) References Cited

U.S. PATENT DOCUMENTS

| | | |
|---|---|---|
| 2010/0277036 A1 | 11/2010 | Shimizu et al. |
| 2013/0285768 A1 | 10/2013 | Watanabe et al. |
| 2015/0033521 A1 | 2/2015 | Watanabe et al. |
| 2019/0363697 A1 | 11/2019 | Yamane |
| 2021/0384885 A1* | 12/2021 | Daimon ............ H03H 9/02834 |
| 2022/0014175 A1 | 1/2022 | Nagatomo et al. |

FOREIGN PATENT DOCUMENTS

| | | |
|---|---|---|
| JP | 6766896 B2 | 10/2020 |
| KR | 20150061029 A | 6/2015 |
| WO | 2009098840 A1 | 8/2009 |
| WO | 2012086639 A1 | 6/2012 |
| WO | 2020204036 A1 | 10/2020 |

OTHER PUBLICATIONS

International Search Report in PCT/JP2022/005638, mailed Apr. 19, 2022, 3 pages.
Written Opinion in PCT/JP2022/005638, mailed Apr. 19, 2022, 5 pages.

* cited by examiner

*Primary Examiner* — Jorge L Salazar, Jr.
(74) *Attorney, Agent, or Firm* — Keating & Bennett, LLP

(57) ABSTRACT

An acoustic wave device includes a piezoelectric layer including lithium tantalate or lithium niobate, a dielectric film on the piezoelectric layer, the dielectric film including a dielectric material having a higher dielectric constant than that of the lithium tantalate or lithium niobate, and an IDT electrode on the dielectric film.

19 Claims, 9 Drawing Sheets

ACOUSTIC WAVE DEVICE AND LADDER FILTER

CROSS REFERENCE TO RELATED APPLICATIONS

This application claims the benefit of priority to Japanese Patent Application No. 2021-021850 filed on Feb. 15, 2021 and is a Continuation Application of PCT Application No. PCT/JP2022/005638 filed on Feb. 14, 2022. The entire contents of each application are hereby incorporated herein by reference.

BACKGROUND OF THE INVENTION

1. Field of the Invention

The present invention relates to an acoustic wave device that includes a piezoelectric layer, an IDT electrode, and a dielectric film interposed therebetween and a ladder filter that includes the acoustic wave device.

2. Description of the Related Art

In the acoustic wave device described in Japanese Patent No. 6766896, a silicon oxide film and a $LiTaO_3$ film are stacked on a support substrate. Another silicon oxide film is stacked on the $LiTaO_3$ film, and an IDT electrode is disposed on the silicon oxide film. The silicon oxide film is interposed between the piezoelectric layer and the IDT electrode in order to improve temperature characteristics.

SUMMARY OF THE INVENTION

In the acoustic wave device described in Japanese Patent No. 6766896, a silicon oxide film is interposed between an IDT electrode and a $LiTaO_3$ film. This structure makes it difficult to reduce the size of the acoustic wave device.

Preferred embodiments of the present invention provide acoustic wave devices each having a reduced size.

An acoustic wave device according to a preferred embodiment of the present invention includes a piezoelectric layer including lithium tantalate or lithium niobate, a dielectric film on the piezoelectric layer, the dielectric film including a dielectric material having a higher dielectric constant than that of the lithium tantalate or lithium niobate, and an IDT electrode on the dielectric film.

A ladder filter according to a preferred embodiment of the present invention includes a serial arm resonator and a parallel arm resonator. The serial arm resonator and the parallel arm resonator include an acoustic wave device according to a preferred embodiment of the present invention. The dielectric film included in the serial arm resonator has a larger thickness than that of the dielectric film included in the parallel arm resonator.

According to preferred embodiments of the present invention, acoustic wave devices with reduced size can be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention are described below with reference to the attached drawings below in order to clarify the present invention.

It should be noted that the preferred embodiments described herein are merely illustrative and the components can be partially replaced or combined with one another among different preferred embodiments.

Figure 1:
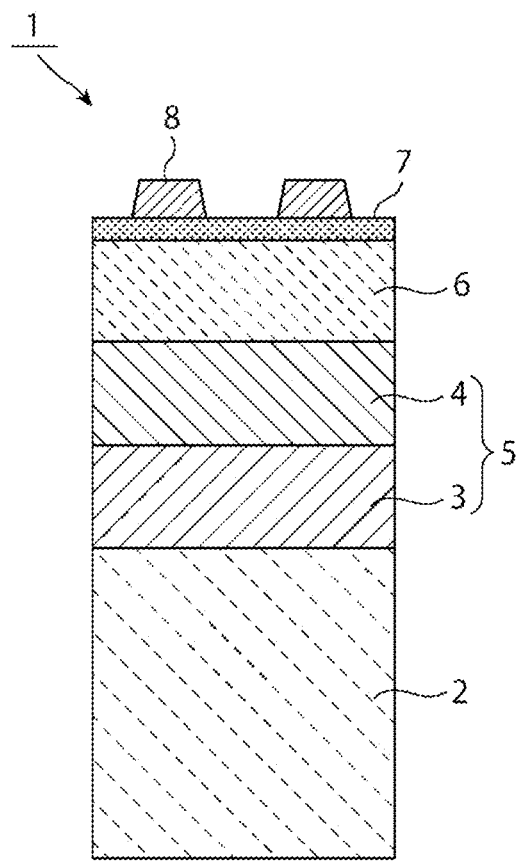
FIG. 1 is a front cross-sectional view of an acoustic wave device according to a first preferred embodiment of the present invention, illustrating the principal portions of the acoustic wave device.
Figure 2:
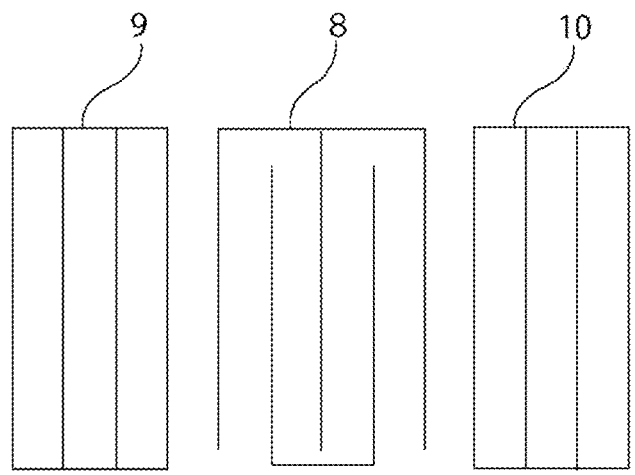
FIG. 2 is a schematic plan view illustrating an electrode structure of the acoustic wave device according to the first preferred embodiment of the present invention.

FIG. 1 is a front cross-sectional view of an acoustic wave device according to a first preferred embodiment of the present invention, illustrating the principal portions of the acoustic wave device. FIG. 2 is a schematic plan view illustrating an electrode structure of the acoustic wave device according to the first preferred embodiment of the present invention.

An acoustic wave device 1 includes a support substrate 2, a piezoelectric layer 6, and an intermediate layer 5 interposed therebetween. In this preferred embodiment, the support substrate 2 includes silicon. The support substrate 2 may include a semiconductor, such as silicon or silicon carbide, an appropriate dielectric substance, such as silicon nitride or aluminum oxide, or a piezoelectric material, such as aluminum nitride or quartz.

The intermediate layer 5 includes a multilayer body including a high-acoustic velocity film 3, which serves as a high-acoustic velocity member layer, and a low-acoustic velocity film 4. The high-acoustic velocity film 3 includes a high-acoustic velocity material through which a bulk wave propagates at an acoustic velocity higher than the acoustic velocity at which an acoustic wave propagates through the piezoelectric layer 6. The high-acoustic velocity material may be selected from various materials including: aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, a DLC (diamond-like carbon) film or diamond, a medium that includes any of the above materials as a principal component, and a medium that includes a mixture of any of the above materials as a principal component.

In this preferred embodiment, the high-acoustic velocity film 3 includes a silicon nitride film.

The low-acoustic velocity film 4 includes a low-acoustic velocity material through which a bulk wave propagates at an acoustic velocity lower than the acoustic velocity at which a bulk wave propagates through the piezoelectric layer 6. In this preferred embodiment, the low-acoustic velocity film 4 includes silicon oxide.

The low-acoustic velocity material may be selected from various materials including: silicon oxide, glass, silicon oxynitride, tantalum oxide, a compound produced by introducing fluorine, carbon, boron, hydrogen, or a silanol group to silicon oxide, and a medium that includes any of the above materials as a principal component.

Figure 12:
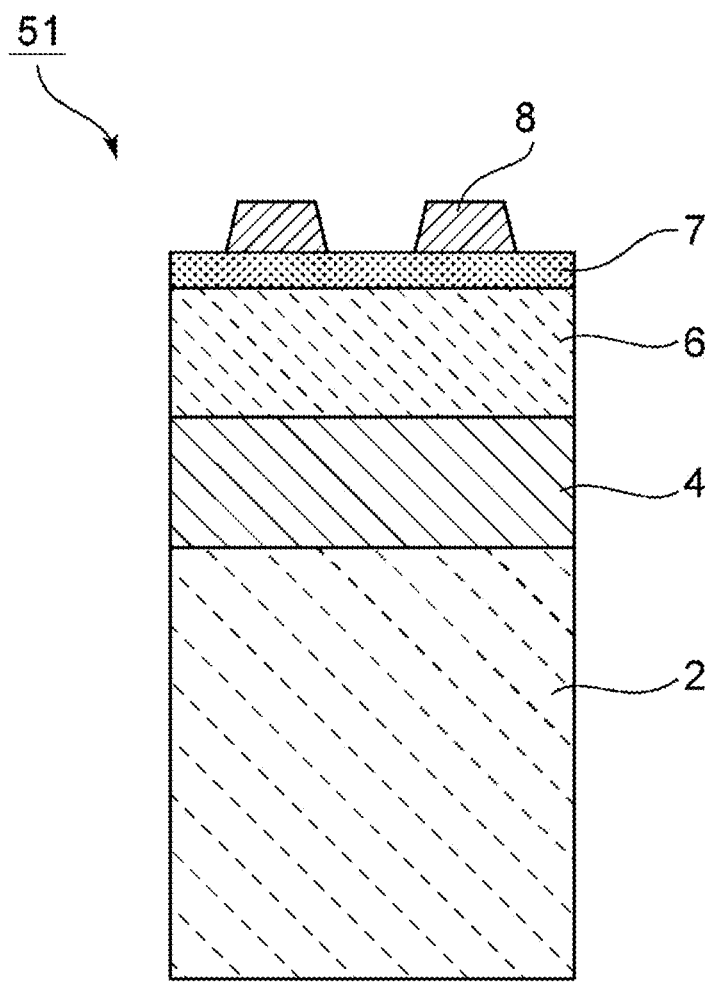
FIG. 12 is a front cross-sectional view of an acoustic wave device according to a first modification example of the first preferred embodiment of the present invention.

In the case where the support substrate 2 includes the high-acoustic velocity material, the high-acoustic velocity film may be omitted as in the acoustic wave device 51 according to a first modification example illustrated in FIG. 12.

The piezoelectric layer 6 includes lithium tantalate or lithium niobate. In this preferred embodiment, the piezoelectric layer 6 includes 30°-rotated Y-cut X-propagation LiTaO$_3$. Note that the crystallographic orientation of the piezoelectric layer 6 is not limited to this.

A dielectric film 7 is disposed on the piezoelectric layer 6. The dielectric film 7 includes a dielectric material having a higher dielectric constant than that of the piezoelectric layer 6, which includes lithium tantalate or lithium niobate. Such a dielectric material is preferably, but not limited to, one dielectric material selected from the group consisting of TiO$_2$, SrTiO$_3$, SrBi$_2$Ta$_2$O$_9$, CaTiO$_3$, and BaTiO$_3$. In such a case, the size of the acoustic wave device can be further reduced. In this preferred embodiment, the dielectric film 7 includes TiO$_2$.

An IDT electrode 8 is disposed on the dielectric film 7. While FIG. 1 illustrates only the portion in which a portion of the IDT electrode 8 is disposed, the electrode structure of the acoustic wave device 1 includes the IDT electrode 8 and reflectors 9 and 10 disposed on the respective sides of the IDT electrode 8 in the direction in which an acoustic wave propagates as illustrated in FIG. 2. Consequently, a one-port acoustic wave resonator is provided.

When a wavelength determined by the electrode finger pitch of the IDT electrode 8 is defined as λ, the thickness of the dielectric film 7 is preferably about 0.05λ or less. In such a case, the size reduction due to generation of capacitance and the adjustment of balance of fractional band width can be both achieved.

In the acoustic wave device 1, the dielectric film 7 includes a dielectric material having a higher dielectric constant than lithium tantalate or lithium niobate of the piezoelectric layer 6. This achieves an increase in capacitance and a reduction in the size of the acoustic wave device 1. The above preferred embodiment is described further specifically with reference to Example 1 and Comparative Example 1 below.

Structure of Example 1

Si was used as a support substrate 2. A SiN film having a thickness of about 300 nm was used as a high-acoustic velocity film 3. A SiO$_2$ film having a thickness of 300 nm was used as a low-acoustic velocity film 4. As a piezoelectric layer 6, an approximately 30°-rotated Y-cut X-propagation LiTaO$_3$ was used. The thickness of the piezoelectric layer 6 was set to about 350 nm.

TiO$_2$ was used as a material of the dielectric film 7. The thickness of the dielectric film 7 was set to about 30 nm.

The IDT electrode 8 was a multilayer body including Ti/AlCu/Ti films. The thicknesses of the Ti/AlCu/Ti films were set to Ti/AlCu/Ti=about 12/100/4 nm. Note that the Ti film of about 12 nm is the Ti film arranged to face the dielectric film 7.

The wavelength determined by the electrode finger pitch of the IDT electrode 8 was set to about 2 μm. The duty was set to about 0.5.

For comparison, an acoustic wave device of Comparative Example 1 was prepared as in Example 1, except that a SiO$_2$ film having a thickness of about 10 nm was formed instead of the TiO$_2$ film.

Figure 3:
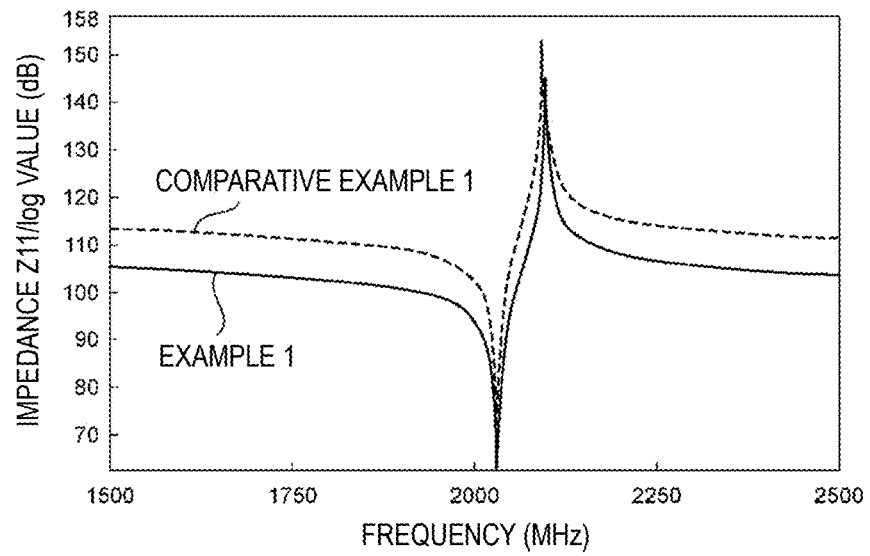
FIG. 3 is a diagram illustrating the resonance characteristics of acoustic wave devices prepared in Example 1 and Comparative Example 1.

FIG. 3 is a diagram illustrating the resonance characteristics of the acoustic wave devices of Example 1 and Comparative Example 1. In Comparative Example 1, the dielectric constant of the SiO$_2$ film is about 4. In contrast, in Example 1, since the dielectric constant of the TiO$_2$ film is about 90, it is possible to achieve a significant size reduction.

Figure 4:
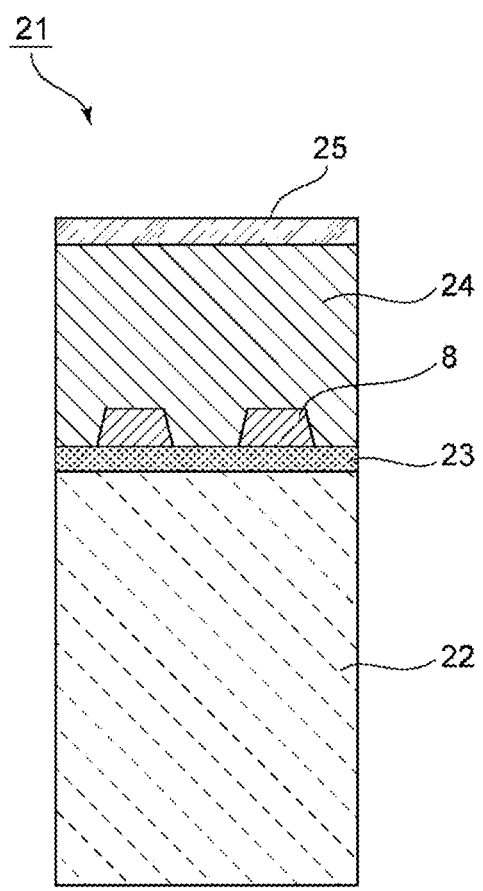
FIG. 4 is a front cross-sectional view of an acoustic wave device according to a second preferred embodiment of the present invention, illustrating the principal portions of the acoustic wave device.

FIG. 4 is a front cross-sectional view of an acoustic wave device according to a second preferred embodiment of the present invention, illustrating the principal portions of the acoustic wave device. In an acoustic wave device 21, an piezoelectric layer 22 is a piezoelectric substrate including lithium niobate. As described above, in a preferred embodiment of the present invention, the piezoelectric layer may be a piezoelectric substrate including lithium niobate or lithium tantalate.

A dielectric film 23 is stacked on the piezoelectric layer 22. The dielectric film 23 includes a dielectric material having a higher dielectric constant than lithium niobate or lithium tantalate of the piezoelectric layer 22. Examples of the dielectric material are the dielectric materials listed in the description of the dielectric film 7 above. In this preferred embodiment, the dielectric film 23 is a TiO$_2$ film.

An IDT electrode 8 is disposed on the dielectric film 23. In the second preferred embodiment, similarly to the above, reflectors are disposed on the respective sides of the IDT electrode 8 in the direction in which an acoustic wave propagates. Consequently, a one-port acoustic wave resonator is provided.

As a second dielectric film 24, a silicon oxide film is arranged to cover the IDT electrode 8. The temperature coefficient of frequency of silicon oxide is positive. This enables the absolute value of the temperature coefficient of frequency in the acoustic wave device 21 to approach 0 and improves the frequency temperature characteristics. As a protective film, a silicon nitride film 25 is disposed on the second dielectric film 24. Note that, in this preferred embodiment, the dielectric film 23 serves a first dielectric film.

Since the dielectric film 23 is interposed between the piezoelectric layer 22 and the IDT electrode 8 in the acoustic wave device 21, it is also possible to reduce the size of the acoustic wave device 21. The above preferred embodiment is described with reference to Example 2 and Comparative Example 2 below.

Structure of Example 2

As a piezoelectric layer 22, a 0° Y-cut X-propagation LiNbO₃ substrate was used. A TiO₂ film having a thickness of about 60 nm was used as a dielectric film 23.

The IDT electrode 8 was a NiCr/Pt/Ti/AlCu/Ti multilayer film. The thicknesses of the sublayers were set to about 10/50/10/200/10 nm in this order. Note that the NiCr film is arranged to face the dielectric film 23.

A SiO₂ film having a thickness of about 870 nm was used as a second dielectric film 24.

The thickness of the silicon nitride film 25 used as a protective film was set to about 30 nm.

The wavelength λ determined by the electrode finger pitch of the IDT electrode 8 was set to about 2 μm. The duty was set to about 0.5.

For comparison, an acoustic wave device of Comparative Example 2 was prepared as in Example 2, except that a silicon oxide film having a thickness of 10 nm was formed instead of the TiO₂ film used as a dielectric film 23.

Figure 5:
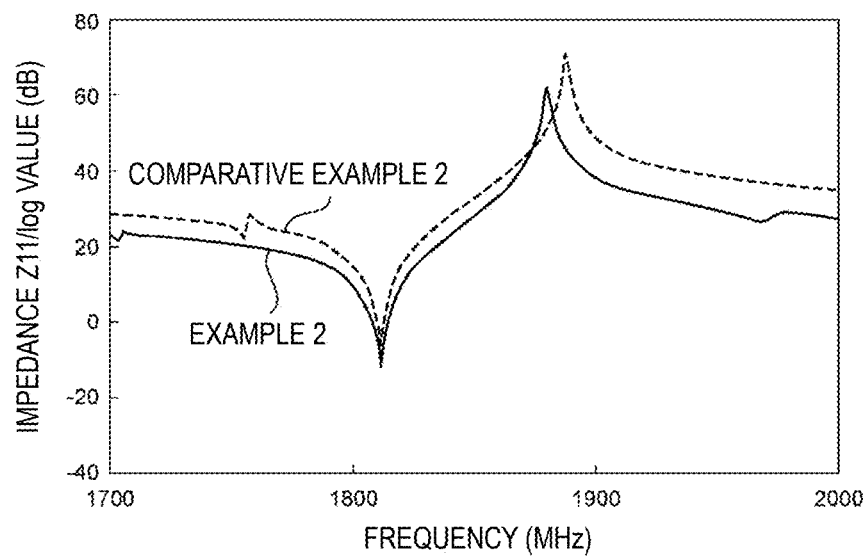
FIG. 5 is a diagram illustrating the resonance characteristics of acoustic wave devices prepared in Example 2 and Comparative Example 2.

FIG. 5 is a diagram illustrating the resonance characteristics of the acoustic wave devices of Example 2 and Comparative Example 2.

As is clear from FIG. 5, the fractional band width measured in Example 2 is narrower than in Comparative Example 2. This is because the dielectric constant of the dielectric film 23 is high (about 90) and capacitance is increased accordingly. Thus, it is possible to achieve a size reduction.

Figure 6:
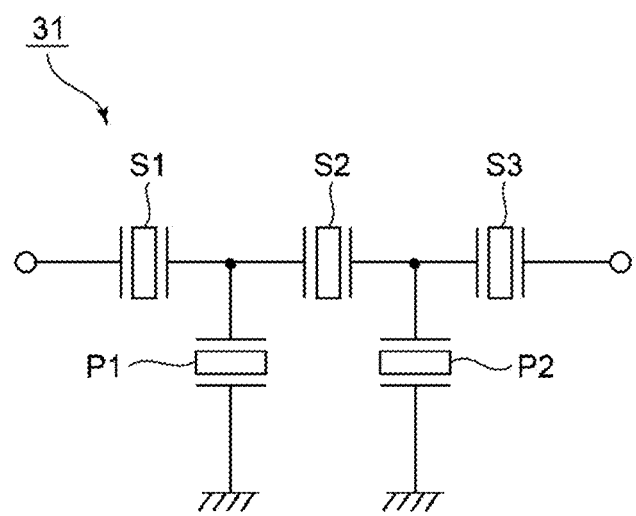
FIG. 6 is a circuit diagram of a ladder filter according to a third preferred embodiment of the present invention.

FIG. 6 is a circuit diagram of a ladder filter according to a third preferred embodiment of the present invention. A ladder filter 31 includes a plurality of serial arm resonators S1 to S3 and a plurality of parallel arm resonators P1 and P2. The serial arm resonators S1 to S3 and the parallel arm resonators P1 and P2 include an acoustic wave device according to a preferred embodiment of the present invention. The thicknesses of the dielectric films included in the serial arm resonators S1 to S3 are set to be larger than the thicknesses of the dielectric films included in the parallel arm resonators P1 and P2. This makes it possible to provide a ladder filter 31 which has suitable filter characteristics and the size of which can be reduced. The above preferred embodiment is described on the basis of the resonance characteristics of the acoustic wave devices prepared in Examples 3 and 4.

Structures of Examples 3 and 4

The acoustic wave device of Example 3 was prepared as in the preparation of the acoustic wave device of Example 1, except that the thickness of the TiO₂ film was set to about 40 nm. The acoustic wave device of Example 3 was used as serial arm resonators S1 to S3.

The acoustic wave device of Example 4 was prepared as in Example 3, except that the thickness of the TiO₂ film was changed from about 40 nm to about 20 nm. The acoustic wave device of Example 4 was used as parallel arm resonators P1 and P2.

Figure 7A:
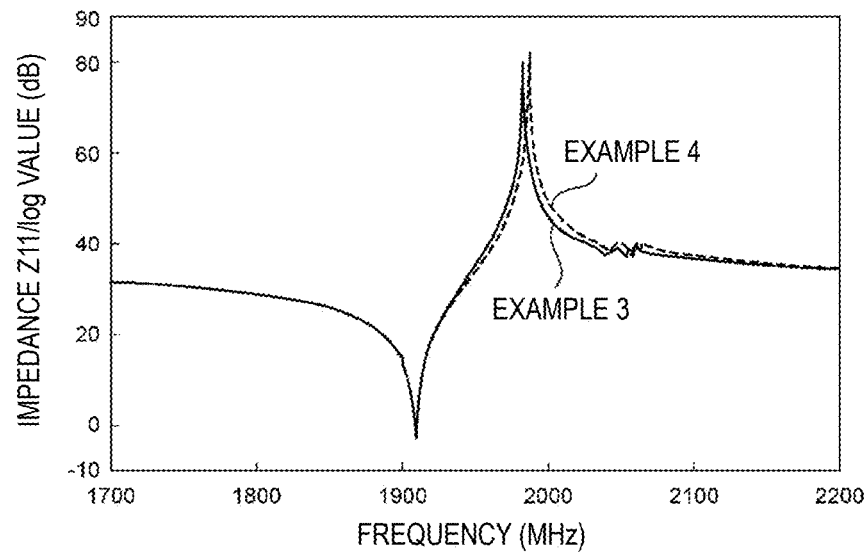
FIG. 7A is a diagram illustrating the resonance characteristics of acoustic wave devices prepared in Examples 3 and 4.
Figure 7B:
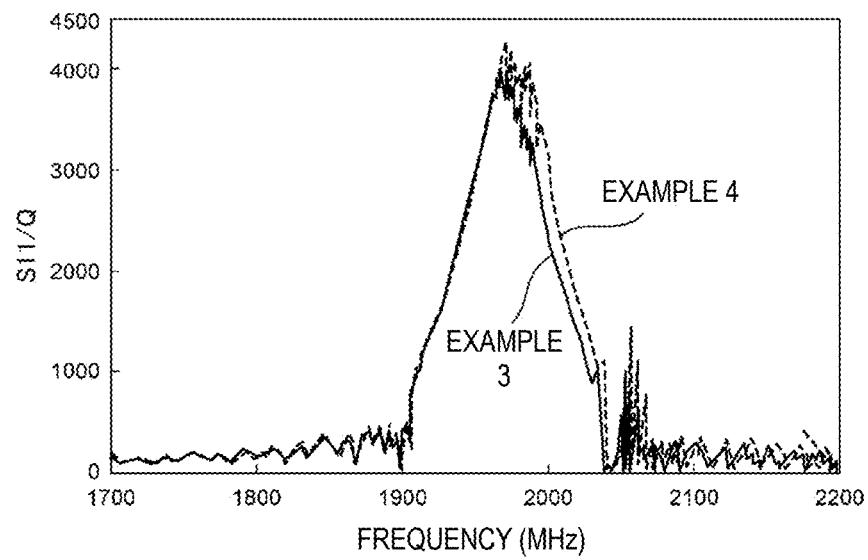
FIG. 7B is a diagram illustrating the Q-characteristics of the acoustic wave devices prepared in Examples 3 and 4.

FIG. 7A is a diagram illustrating the resonance characteristics of the acoustic wave devices of Examples 3 and 4, and FIG. 7B is a diagram illustrating the Q-characteristics of the acoustic wave devices of Examples 3 and 4.

As is clear from FIGS. 7A and 7B, in Example 3, the resonance characteristics were slightly poor in the vicinity of the anti-resonant frequency, compared with Example 4. However, for the serial arm resonators S1 to S3, the characteristics in the vicinity of the resonant frequency is more important than those in the vicinity of the anti-resonant frequency. Thus, the filter characteristics are not likely to become degraded even when the acoustic wave device of Example 3 is used as serial arm resonators S1 to S3. Furthermore, it is desirable that the serial arm resonators S1 to S3 have a narrow fractional band width, because, in such a case, the steepness of the filter characteristics of the ladder filter 31 in a high-pass band zone can be enhanced. Thus, since the ladder filter 31 includes the serial arm resonators S1 to S3 and the parallel arm resonators P1 and P2 that include an acoustic wave device according to a preferred embodiment of the present invention as described above, it is possible to achieve a size reduction. In addition, suitable filter characteristics can be achieved.

As is clear from Examples 3 and 4, the resonance characteristics vary with the change in the thickness of the TiO₂ film. In particular, the fractional band width is reduced.

Then, acoustic wave devices having the same structure as the acoustic wave device of Example 3 above were prepared while the thickness of the TiO₂ film was changed.

Figure 8:
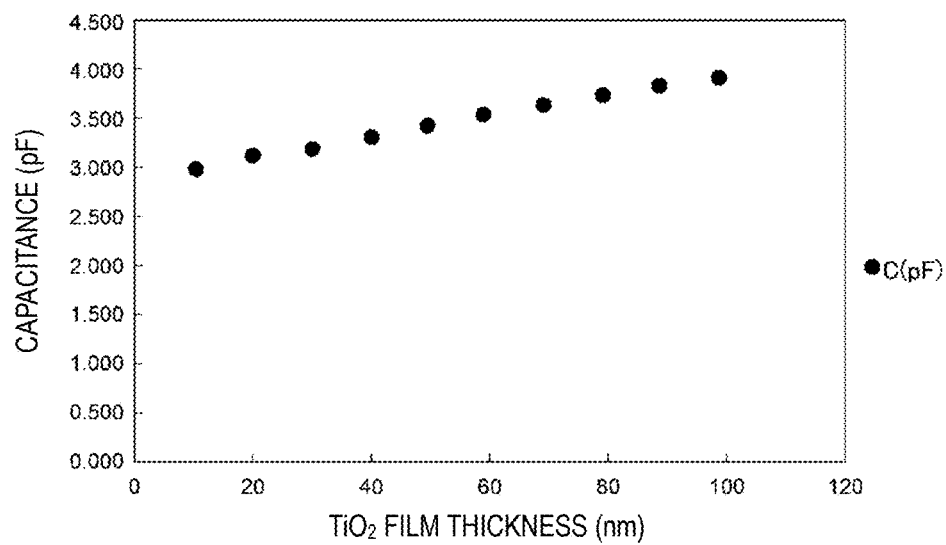
FIG. 8 is a diagram illustrating the relationship between the thickness of a $TiO_2$ film and capacitance.
Figure 9:
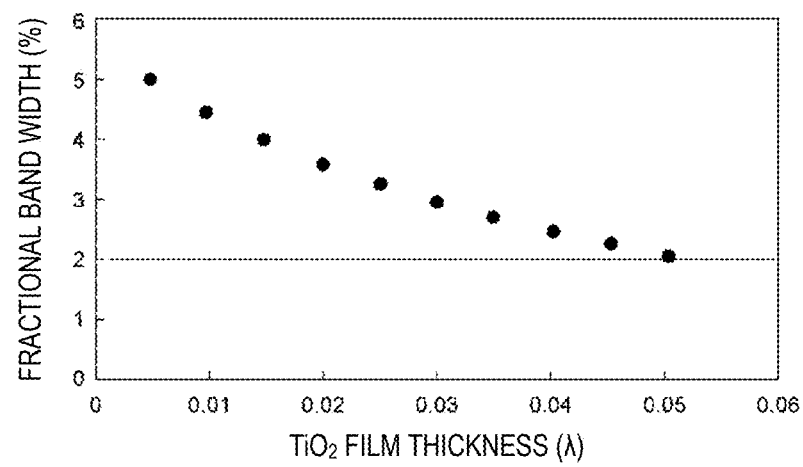
FIG. 9 is a diagram illustrating the relationship between the thickness of a $TiO_2$ film and a fractional band width as a resonator.

FIG. 8 is a diagram illustrating the relationship between the thickness of the TiO₂ film and capacitance. FIG. 9 is a diagram illustrating the relationship between the thickness of the TiO₂ film and the fractional band width as a resonator.

As is clear from FIG. 8, the larger the thickness of the TiO₂ film, the larger the capacitance. Accordingly, as illustrated in FIG. 9, the larger the thickness of the TiO₂ film, the narrower the fractional band width. In the case where an acoustic wave device according to a preferred embodiment of the present invention is used as an acoustic wave resonator for band-pass filters, the fractional band width is desirably about 2% or more. Therefore, the thickness of the TiO₂ film is preferably about 100 nm or less as illustrated in FIG. 9, that is, about 0.05λ or less in terms of thickness normalized with wavelength.

Acoustic wave devices similar to those prepared in Example 3 above was prepared, except that the cut-angle F of Y-cut X-propagation LiTaO₃ was changed within the range of about 0° or more and about 90° or less in steps of 5° and the thickness was set to about 400 nm. Furthermore, the thickness of the dielectric film was changed within the range of about 10 nm or more and about 200 nm or less in steps of about 10 nm. Moreover, the dielectric constant of the dielectric film was changed within the range of about 5 or more and about 1200 or less in steps of 50. The fractional band widths of a plural types of acoustic wave devices prepared as described above were measured. As a result, it was found that the fractional band width falls within the range of about 2% or more when the thickness t [λ] and dielectric constant ε of the dielectric film, and the cut-angle F [deg] of the Y-cut X-propagation LiTaO₃ are set so as to satisfy Formula (1) below.

$$2\% \leq 0.99088187121749 + (-0.00101988808513476) \times (\varepsilon - 600.463000404367) + (-22.4050537909368) \times (t[\lambda] - 0.0499332794177113) + (-0.0115965045308728) \times (F[\deg] - 44.9898908208654) + 0.0000007919482685655 \times ((\varepsilon - 600.463000404367) \times (\varepsilon - 600.463000404367) - 130192.254292171) + 0.0139683156473993 \times ((\varepsilon - 600.463000404367) \times (t[\lambda] - 0.0499332794177113)) + 387.718922759073 \times ((t[\lambda] - 0.0499332794177113) \times (t[\lambda] - 0.0499332794177113) - 0.000824348560899287) + 0.0000123217252983298 \times ((\varepsilon - 600.463000404367) \times (F[\deg] - 44.9898908208654)) + 0.264999245824291 \times ((t[\lambda] - 0.0499332794177113) \times (F[\deg] - 44.9898908208654)) + (-$$

$$0.000219172606976882) \times ((F[\deg]-$$
$$44.9898908208654) \times (F[\deg]-$$
$$44.9898908208654) - 827.102607064512) \qquad \text{Formula(1)}.$$

Figure 10:
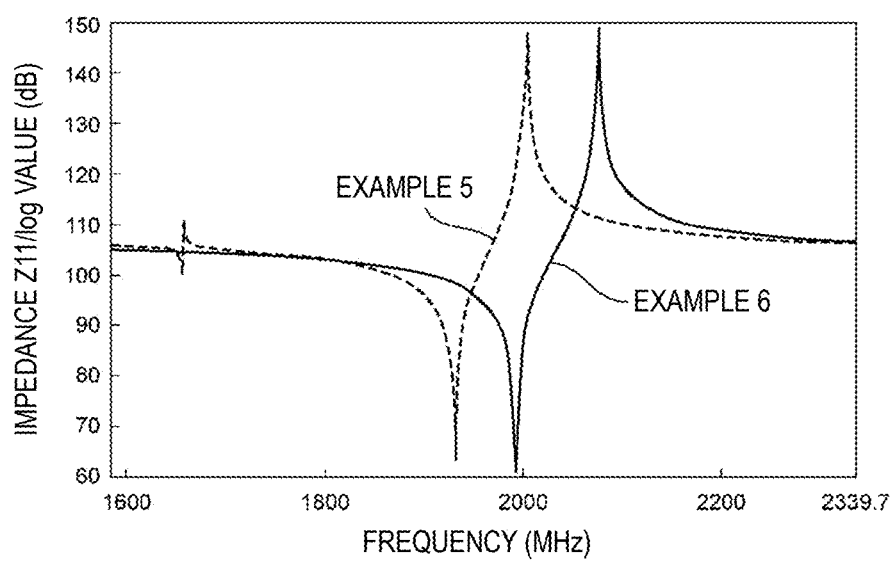
FIG. 10 is a diagram illustrating the resonance characteristics of acoustic wave devices prepared in Examples 5 and 6.

FIG. 10 is a diagram illustrating the resonance characteristics of acoustic wave devices of Examples 5 and 6 which had the following design parameters.

Structures of Examples 5 and 6

In Example 5, the cut-angle of Y-cut X-propagation LiTaO$_3$ was set to about 0°, and the thickness was set to about 300 nm. The thickness of the TiO$_2$ film was set to about 10 nm. The other structure of the acoustic wave device prepared in Example 5 was the same as in Example 1.

In Example 6, an acoustic wave device was prepared as in Example 5, except that the cut-angle of Y-cut X-propagation LiTaO$_3$ was set to about 25° and the thickness of the TiO$_2$ film was set to about 20 nm.

As illustrated in FIG. 10, in Example 5, responses due to Rayleigh waves occurred in the vicinity of about 1660 MHz. In contrast, in Example 6, responses that are considered due to Rayleigh waves did not occur. This confirms that spurious responses due to Rayleigh waves can be reduced by selecting an appropriate thickness of the TiO$_2$ film and an appropriate crystallographic orientation of the piezoelectric layer.

Subsequently, the cut-angle F of Y-cut X-propagation LiTaO$_3$ was changed within the range of about 10° or more and about 60° or less in steps of about 5°, and the thickness was set to about 350 nm. Furthermore, the thickness of the TiO$_2$ film was changed within the range of about 10 nm or more and about 100 nm or less in steps of about 10 nm. The other design parameters were set as in Example 6.

A plurality of different types of acoustic wave devices were prepared under the above conditions, and the range in which the phase of Rayleigh waves was about −80 degrees or less was determined. As a result, it was confirmed that Formula (2) is preferably satisfied in order to set the phase of Rayleigh waves to about −80 degrees or less. Note that the thickness t [λ] of the TiO$_2$ film is a thickness normalized with the wavelength λ determined by the electrode finger pitch of the IDT electrode, and F [deg] is the cut-angle of Y-cut X-propagation LiTaO$_3$.

$$-80[\deg] \geq (-44.9733034909963) +$$
$$2.06261547493274 \times (F[\deg]-$$
$$35.062015503876) + 635.549954735572 \times (t[\lambda]-$$
$$0.0275193798449612) + 0.0952699670513029 \times$$
$$((F[\deg]-35.062015503876) \times (F[\deg]-$$
$$35.062015503876) - 226.174448650922) +$$
$$52.2497839562047 \times ((F[\deg]-$$
$$35.062015503876) \times (t[\lambda]-$$
$$0.0275193798449612)) + (-7899.86645624221) \times$$
$$((t[\lambda]-0.0275193798449612) \times (t[\lambda]-$$
$$0.0275193798449612) - 0.000207606213568896) \qquad \text{Formula(2)}.$$

Thus, it is possible to effectively reduce the responses due to Rayleigh waves by selecting the cut-angle F and the thickness t of the TiO$_2$ film which satisfy Formula (2) above.

Figure 11:
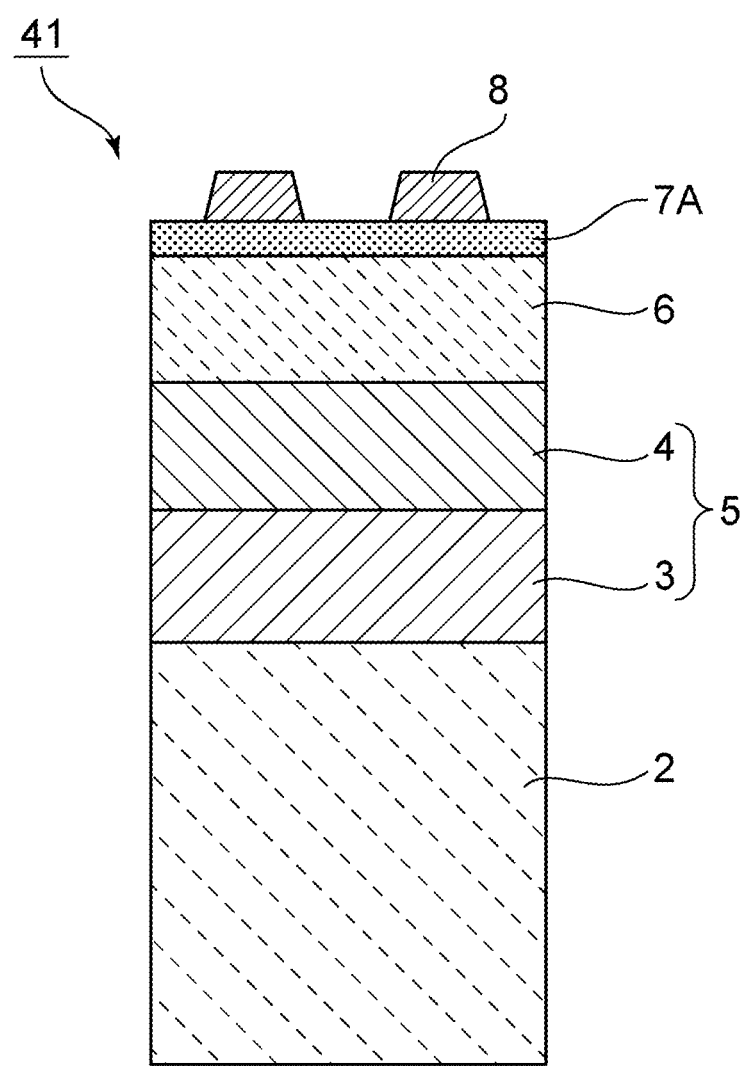
FIG. 11 is a front cross-sectional view of an acoustic wave device according to a fourth preferred embodiment of the present invention, illustrating the principal portions of the acoustic wave device.

FIG. 11 is a front cross-sectional view of an acoustic wave device according to a fourth preferred embodiment of the present invention, illustrating the principal portions of the acoustic wave device. In an acoustic wave device 41, a dielectric film 7A includes CaTiO$_3$. The other structure of the acoustic wave device 41 is the same as that of the acoustic wave device 1. Since the dielectric constant of CaTiO$_3$ is 140, the capacitance of the acoustic wave device 41 can be increased and it is possible to reduce the size of the acoustic wave device 41.

An acoustic wave device of Example 7 below was prepared as an example of the acoustic wave device 41.

Structure of Example 7

In Example 7, similarly to Example 6, the cut-angle F of Y-cut X-propagation LiTaO$_3$ was changed within the range of about 0° or more and about 90° or less in steps of about 5°. The thickness was changed within the range of about 300 nm or more and about 400 nm or less in steps of about 50 nm. The thickness of the CaTiO$_3$ film was changed within the range of about 10 nm or more and about 100 nm or less in steps of about 10 nm. The other structure was the same as in Example 6. Acoustic wave devices were prepared under the above conditions and subjected to the measurement of resonance characteristics and phase characteristics. It was confirmed that Formula (3) is preferably satisfied in order to set the phase of Rayleigh waves to about −80 degrees or less. Note that t [λ] is the thickness of the CaTiO$_3$ film which is normalized with λ, F [deg] is the cut-angle of Y-cut X-propagation LiTaO$_3$, and t_LT [λ] is the thickness of LiTaO$_3$ which is normalized with λ.

$$-80[\deg] \geq (-28.1519168710076) +$$
$$16.3927771813082 \times (t[\lambda]-$$
$$0.0274514038876891) + 1.451571123731 \times (F$$
$$[\deg]-44.9730021598272) + 190.76171323928 \times$$
$$(t\_LT[\lambda]-0.199892008639309) + (-$$
$$1630.52997244197) \times ((t[\lambda]-$$
$$0.0274514038876891) \times (t[\lambda]-$$
$$0.0274514038876891) -$$
$$0.000206787595221326) + 11.7270198827755 \times ((t$$
$$[\lambda]-0.0274514038876891) \times (F[\deg]-$$
$$44.9730021598272)) + 0.0325641412336404 \times ((F$$
$$(\deg)-44.9730021598272) \times (F[\deg]-$$
$$44.9730021598272) - 749.486312153343) + (-$$
$$2760.19968889668) \times ((t[\lambda]-$$
$$0.0274514038876891) \times (t\_LT[\lambda]-$$
$$0.199892008639309)) + 1.50835034999896 \times ((F$$
$$[\deg]-44.9730021598272) \times (t\_LT[\lambda]-$$
$$0.199892008639309)) + (-983.831618195462) \times$$
$$((t\_LT[\lambda]-0.199892008639309) \times (t\_LT[\lambda]-$$
$$0.199892008639309) - 0.00124998833786601) \qquad \text{Formula(3)}.$$

As described above, even in the case where a CaTiO$_3$ film was used as a dielectric film 7A, it is possible to effectively reduce the responses due to Rayleigh waves by selecting the cut-angle in the piezoelectric layer, such as LiTaO$_3$, and the thickness of the dielectric film so as to satisfy Formula (3) above.

Structure of Example 8

In Example 8, a multilayer structure similar to that used in Example 1 was used. The thicknesses of the stacked layers were set as described below. A SiN film having a thickness of about 300 nm was used as a high-acoustic velocity film 3. A SiO$_2$ film having a thickness of about 300 nm was used as a low-acoustic velocity film 4. LiTaO$_3$ having a thickness of about 400 nm was used as a piezoelectric layer 6. The crystallographic orientation in the piezoelectric layer 6 was changed from an approximately 20°-rotated Y-cut X-propagation to an approximately 40°-rotated Y-cut X-propagation in steps of about 5°.

The IDT electrode 8 was a Ti/1% AlCu/Ti multilayer body. The thicknesses of the sublayers were set to about 12/100/4 nm in this order. Note that "12" is the Ti film arranged to face the dielectric film 7, and "1% AlCu" is an Al—Cu alloy containing about 1% by weight Cu.

The wavelength λ determined by the electrode finger pitch of the IDT electrode 8 was set to about 2 μm. The duty was set to about 0.5.

The Young's modulus of the dielectric film 7 was changed within the range of about 50 GPa or more and about 300 GPa or less in steps of about 50 GPa by changing the material.

The density of the dielectric film 7 was also changed within the range of about 2 kg/m$^3$ or more and about 8 kg/m$^3$ or less in steps of about 2 kg/m$^3$ by changing the material.

The dielectric constant of the dielectric film 7 was changed within the range of about 30 or more and about 380 or less in steps of about 30.

The thickness of the dielectric film 7 was also changed within the range of about 0.005λ or more and about 0.025λ in steps of about 0.005λ.

A plural of different types of acoustic wave devices were prepared under the above-described conditions and the resonance characteristics of the acoustic wave devices were measured to determine the fractional band width. As a result, it was found that the fractional band width falls within the range of about 2% or more when the thickness t [λ], dielectric constant ε, Young's modulus Y [GPa], and density d [kg/m$^3$] of the dielectric film and the cut-angle F [deg] of the Y-cut X-propagation LiTaO$_3$ are preferably set so as to satisfy Formula (4) below. The fractional band width is preferably about 5% or less.

2%≤3.55997014174841+(−0.00487639130068411)×(ε−214.938048528653)+(−96.1860635815859)×(t[λ]−0.0150029039752191)+(−0.000905681048192359)×(Y[GPa]−175.058079504388)+0.00824228277987659×(d[kg/m$^3$])−4.99793495095509)+(−0.0145933761699339×(F[deg]−29.9948373773877)+0.0000050964535495431×((ε−214.938048528653)×(ε−214.938048528653)−10712.2961103896)+(−0.107863323498494)×((ε−214.938048528653)×(t[λ]−0.0150029039752191))+2239.21557361176×((t[λ]−0.0150029039752191)×(t[λ]−0.0150029039752191)−0.0000416357362752375)+0.0000013354691325545×(ε−214.938048528653)×(Y[GPa]−175.058079504388))+(−0.0304100554188182)×((t[λ]−0.0150029039752191)×(Y[GPa]−175.058079504388))+(−0.0000010413074656026)×((Y[GPa]−175.058079504388)×(Y[GPa]−175.058079504388)−7293.81438619308)+(−0.0000132983072396513)×((ε−214.938048528653)×(d[kg/m$^3$]−4.99793495095509))+0.0863723207629641×((t[λ]−0.0150029039752191)×(d[kg/m$^3$])−4.99793495095509))+0.0000167841751038366×((Y[GPa]−175.058079504388)×(d[kg/m$^3$]−4.99793495095509))+(−0.000414005073987127)×((d[kg/m$^3$]−4.99793495095509)×(d[kg/m$^3$]−4.99793495095509)−4.99999573557258)+0.0000174917316317782×((ε−214.938048528653)×(F[deg]−29.9948373773877))+0.36085793354616×((t[λ]−0.0150029039752191)×(F[deg]−29.9948373773877))+0.0000242921538496177×((Y[GPa]−175.058079504388)×(F[deg]−29.9948373773877))+(−0.00064755173208376)×((d[kg/m$^3$]−4.99793495095509)×(F[deg]−29.9948373773877))+(−0.00127840848717812)×((F[deg]−29.9948373773877)×(F[deg]−29.9948373773877)−66.6494312719515)    Formula(4).

It was also discovered that, on the basis of the resonance characteristics of the plurality of types of acoustic wave devices, Formula (5) below is preferably satisfied in order to set the phase of Rayleigh waves to about −70 degrees or less.

−70[deg]≥(−81.4539695268014)+(−0.00966553006239941)×(ε−214.938048528653)+(−28.7384097206604)×(t[λ]−0.0150029039752191)+0.0140446172641962×(Y[GPa]−175.058079504388)+(−0.031843017281659)×(d[kg/m$^3$]−4.99793495095509)+(−0.0200499558107732)×(F[deg]−29.9948373773877)+0.0000039945249932592×((ε−214.938048528653)×(ε−214.938048528653)−10712.2961103896)+(−0.435908407015534)×((ε−214.938048528653)×(t[λ]−0.0150029039752191))+9514.16544149263×((t[λ]−0.0150029039752191)×(t[λ]−0.0150029039752191)−0.0000416357362752375)+(−0.0000203960328176233)×((ε−214.938048528653)×(Y[GPa]−175.058079504388))+1.91626320402691×((t[λ]−0.0150029039752191)×(Y[GPa]−175.058079504388))+0.0000832582661745741×((Y[GPa]−175.058079504388)×(Y[GPa]−175.058079504388)−7293.81438619308)+0.0000557668464408111×((ε−214.938048528653)×(d[kg/m$^3$]−4.99793495095509))+7.12941407416046×((t[λ]−0.0150029039752191)×(d[kg/m$^3$]−4.99793495095509))+0.000808241126650524×((Y[GPa]−175.058079504388)×(d[kg/m$^3$]−4.99793495095509))+0.00530823399771564×((d[kg/m$^3$]−4.99793495095509)×(d[kg/m$^3$]−4.99793495095509)−4.99999573557258)+(−0.0000809595127343291)×((−214.938048528653)×(F[deg]−29.9948373773877))+72.1546109741105×((t[λ]−0.0150029039752191)×(F[deg]−29.9948373773877))+0.00525228623315905×((Y[GPa]−175.058079504388)×(F[deg]−29.9948373773877))+0.0267634642575147×((d[kg/m$^3$]−4.99793495095509)×(F[deg]−29.9948373773877))+0.110545056950365×((F[deg]−29.9948373773877)×(F[deg]−29.9948373773877)−66.6494312719515)    Formula(5).

Figure 13:
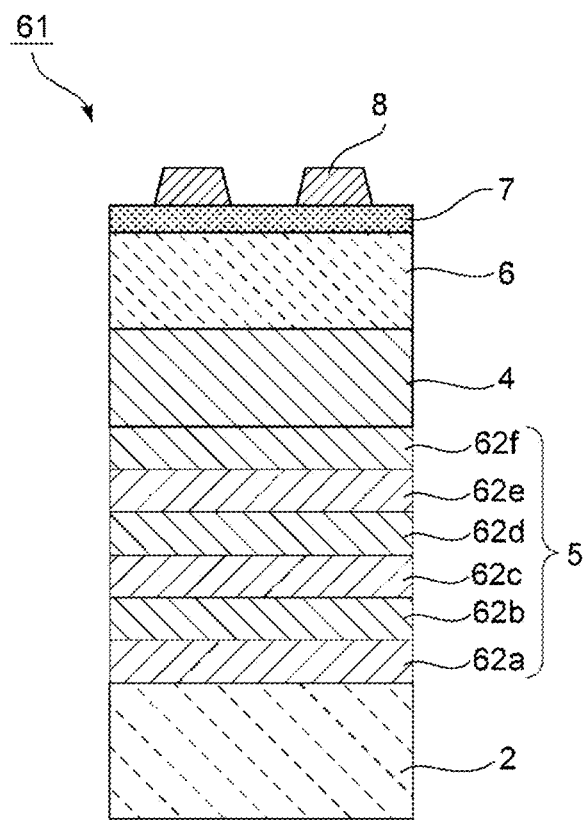
FIG. 13 is a front cross-sectional view of an acoustic wave device according to a second modification example of the first preferred embodiment of the present invention.

In the acoustic wave device 1, the intermediate layer 5 is interposed between the support substrate 2 and the piezoelectric layer 6. The intermediate layer 5 may be an acoustic reflection film including a multilayer body including a low-acoustic impedance layer and a high-acoustic impedance layer. Specifically, the low-acoustic impedance layer is a layer having a relatively low acoustic impedance, while the high-acoustic impedance layer is a layer having a relatively high acoustic impedance. For example, an acoustic wave device 61 according to a second modification example illustrated in FIG. 13 includes an intermediate layer 5 including a multilayer body including low-acoustic impedance layers 62b, 62d, and 62f and high-acoustic impedance layers 62a, 62c, and 62e.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric layer including lithium tantalate or lithium niobate;
a dielectric film located on the piezoelectric layer and including a dielectric material with a higher dielectric constant than that of the lithium tantalate or lithium niobate; and
an IDT electrode on the dielectric film; wherein
when a dielectric constant of a dielectric substance of the dielectric film is defined as ε and a wavelength determined by an electrode finger pitch of the IDT electrode is defined as λ, when a thickness of the dielectric film normalized with λ is defined as t [λ], the piezoelectric layer includes LiTaO$_3$, and a cut-angle of the LiTaO$_3$ is defined as F [deg], Formula (1) is satisfied:

2‰≤0.99088187121749+(−0.00101988808513476)×
(ε−600.463000404367)+(−22.4050537909368)×
(t[λ]−0.0499332794177113)+(−
0.0115965045308728)×(F[deg]−
44.9898908208654)+0.0000007919482685655×
((ε−600.463000404367)×(ε−
600.463000404367)−130192.254292171)+
0.0139683156473993×((ε−600.463000404367)×
(t[λ]−0.0499332794177113))+
387.718922759073×((t[λ]−
0.0499332794177113)×(t[λ]−
0.0499332794177113)−
0.000824348560899287)+
0.0000123217252983298×((ε−
600.463000404367)×(F[deg]−
44.9898908208654))+0.264999245824291×((t
[λ]−0.0499332794177113)×(F[deg]−
44.9898908208654))+(−
0.000219172606976882)×((F[deg]−
44.9898908208654)×(F[deg]−
44.9898908208654)−827.102607064512)   Formula(1).

2. The acoustic wave device according to claim 1, wherein the dielectric film includes one dielectric material selected from a group consisting of TiO$_2$, SrTiO$_3$, SrBi$_2$Ta$_2$O$_9$, CaTiO$_3$, and BaTiO$_3$.

3. The acoustic wave device according to claim 1, wherein, a thickness of the dielectric film is about 0.05λ or less.

4. The acoustic wave device according to claim 1, further comprising a support substrate, and an intermediate layer interposed between the support substrate and the piezoelectric layer.

5. The acoustic wave device according to claim 4, wherein the intermediate layer includes a low-acoustic velocity film including a low-acoustic velocity material through which a bulk wave propagates at an acoustic velocity lower than an acoustic velocity at which a bulk wave propagates through the piezoelectric layer.

6. The acoustic wave device according to claim 5, wherein the intermediate layer further includes a high-acoustic velocity layer including a high-acoustic velocity material through which a bulk wave propagates at an acoustic velocity higher than the acoustic velocity at which the acoustic wave propagates through the piezoelectric layer, and the high-acoustic velocity layer is interposed between the low-acoustic velocity film and the support substrate.

7. The acoustic wave device according to claim 4, wherein the support substrate includes a high-acoustic velocity material through which a bulk wave propagates at an acoustic velocity higher than an acoustic velocity at which an acoustic wave propagates through the piezoelectric layer.

8. The acoustic wave device according to claim 4, wherein the intermediate layer is an acoustic reflection film including a low-acoustic impedance layer having a relatively low acoustic impedance and a high-acoustic impedance layer having a relatively high acoustic impedance.

9. The acoustic wave device according to claim 1, wherein the piezoelectric layer is a piezoelectric substrate including the lithium tantalate or the lithium niobate.

10. The acoustic wave device according to claim 1, wherein
the dielectric film is a first dielectric film;
the acoustic wave device further comprises a second dielectric film arranged to cover the IDT electrode; and
the second dielectric film includes a dielectric substance having a positive temperature coefficient of frequency.

11. The acoustic wave device according to claim 10, wherein the second dielectric film includes silicon oxide.

12. A ladder filter comprising:
a serial arm resonator; and
a parallel arm resonator; wherein
at least one of the serial arm resonator and the parallel arm resonator is defined by an acoustic wave device including:
  a piezoelectric layer including lithium tantalate or lithium niobate;
  a dielectric film located on the piezoelectric layer and including a dielectric material with a higher dielectric constant than that of the lithium tantalate or lithium niobate; and
  an IDT electrode on the dielectric film; and
the dielectric film included in the serial arm resonator has a larger thickness than that of the dielectric film included in the parallel arm resonator.

13. The ladder filter according to claim 12, wherein the at least one of the serial arm resonator and the parallel arm resonator includes both of the serial arm resonator and the parallel arm resonator.

14. The ladder filter according to claim 12, wherein the dielectric film includes one dielectric material selected from a group consisting of TiO$_2$, SrTiO$_3$, SrBi$_2$Ta$_2$O$_9$, CaTiO$_3$, and BaTiO$_3$.

15. The ladder filter according to claim 12, wherein, when a wavelength determined by an electrode finger pitch of the IDT electrode is defined as λ, a thickness of the dielectric film is about 0.05λ or less.

16. An acoustic wave device comprising:
a piezoelectric layer including lithium tantalate or lithium niobate;
a dielectric film located on the piezoelectric layer and including a dielectric material with a higher dielectric constant than that of the lithium tantalate or lithium niobate; and
an IDT electrode on the dielectric film; wherein
when a dielectric constant of a dielectric substance constituting the dielectric film is defined as ε and a wavelength determined by an electrode finger pitch of the IDT electrode is defined as λ, when a thickness of the dielectric film normalized with λ is defined as t [λ], a Young's modulus of the dielectric film is defined as Y [GPa], a density of the dielectric film is defined as d [kg/m$^3$], the piezoelectric layer includes LiTaO$_3$, and a cut-angle of the LiTaO$_3$ is defined as F [deg], Formula (4) is satisfied:

2‰≤3.55997014174841+(−0.00487639130068411)×
(ε−214.938048528653)+(−96.1860635815859)×
(t[λ]−0.0150029039752191)+(−
0.000905681048192359)×(Y[GPa]−
175.058079504388)+0.00824228277987659×(d
[kg/m$^3$])−4.99793495095509)+(−
0.0145933761699339×(F[deg]−
29.9948373773877)+0.0000050964535495431×
((ε−214.938048528653)×(ε−
214.938048528653)−10712.2961103896)+(−
0.107863323498494)×((ε−214.938048528653)×
(t[λ]−0.0150029039752191))+
2239.21557361176×((t[λ]−
0.0150029039752191)×(t[λ]−
0.0150029039752191)−
0.0000416357362752375)+
0.0000013354691325545×((ε−
214.938048528653)×(Y[GPa]−
175.058079504388))+(−0.0304100554188182)×
((t[λ]−0.0150029039752191)×(Y[GPa]−
175.058079504388))+(−
0.0000010413074656026)×((Y[GPa]−
175.058079504388)×(Y[GPa]−
175.058079504388)−7293.81438619308)+(−
0.0000132983072396513)×((ε−

214.938048528653)×(d[kg/m³]−4.99793495095509))+0.0863723207629641×((t[λ]−0.0150029039752191)×(d[kg/m³])−4.99793495095509)+0.0000167841751038366×((Y[GPa]−175.058079504388)×(d[kg/m³]−4.99793495095509))+(−0.000414005073987127)×((d[kg/m³]−4.99793495095509)×(d[kg/m³]−4.99793495095509)−4.99999573557258)+0.0000174917316317782×((ε−214.938048528653)×(F[deg]−29.9948373773877))+0.36085793354616×((t[λ]−0.0150029039752191)×(F[deg]−29.9948373773877))+0.0000242921538496177×((Y[GPa]−175.058079504388)×(F[deg]−29.9948373773877))+(−0.00064755173208376)×((d[kg/m³]−4.99793495095509)×(F[deg]−29.9948373773877))+(−0.00127840848717812)×((F[deg]−29.9948373773877)×(F[deg]−29.9948373773877)−66.6494312719515) Formula(4).

17. The acoustic wave device according to claim 16, wherein Formula (5) is satisfied:

−70[deg]≥(−81.4539695268014)+(−0.00966553006239941)×(ε−214.938048528653)+(−28.7384097206604)×(t[λ]−0.0150029039752191)+0.0140446172641962×(Y[GPa]−175.058079504388)+(−0.031843017281659)×(d[kg/m³]−4.99793495095509)+(−0.0200499558107732)×(F[deg]−29.9948373773877)+0.0000039945249932592×((ε−214.938048528653)×(ε−214.938048528653)−10712.2961103896)+(−0.435908407015534)×((ε−214.938048528653)×(t[λ]−0.0150029039752191))+9514.16544149263×((t[λ]−0.0150029039752191)×(t[λ]−0.0150029039752191)−0.0000416357362752375)+(−0.0000203960328176233)×((ε−214.938048528653)×(Y[GPa]−175.058079504388))+1.91626302402691×((t[λ]−0.0150029039752191)×(Y[GPa]−175.058079504388))+0.0000832582661745741×((Y[GPa]−175.058079504388)×(Y[GPa]−175.058079504388)−7293.81438619308)+0.0000557668464408111×((ε−214.938048528653)×(d[kg/m³]−4.99793495095509)+7.12941407416046×((t[λ]−0.0150029039752191)×(d[kg/m³]−4.99793495095509)+0.000808241126650524×((Y[GPa]−175.058079504388)×(d[kg/m³]−4.99793495095509)+0.00530823399771564×((d[kg/m³]−4.99793495095509)×(d[kg/m³]−4.99793495095509)−4.99999573557258)+(−0.0000809595127343291)×((ε−214.938048528653)×(F[deg]−29.9948373773877))+72.1546109741105×((t[λ]−0.0150029039752191)×(F[deg]−29.9948373773877))+0.00525228623315905×((Y[GPa]−175.058079504388)×(F[deg]−29.9948373773877))+0.0267634642575147×((d[kg/m³]−4.99793495095509)×(F[deg]−29.9948373773877))+0.110545056950365×((F[deg]−29.9948373773877)×(F[deg]−29.9948373773877)−66.6494312719515) Formula(5).

18. An acoustic wave device comprising:
a piezoelectric layer including lithium tantalate or lithium niobate;
a dielectric film located on the piezoelectric layer and including a dielectric material with a higher dielectric constant than that of the lithium tantalate or lithium niobate; and
an IDT electrode on the dielectric film; wherein;
when the dielectric film includes $TiO_2$ and a wavelength determined by an electrode finger pitch of the IDT electrode is defined as λ, when a thickness of the dielectric film normalized with λ is defined as t [λ], the piezoelectric layer includes $LiTaO_3$, and a cut-angle of the $LiTaO_3$ is defined as F [deg], Formula (2) is satisfied:

−80[deg]≥(−44.9733034909963)+2.06261547493274×(F[deg]−35.062015503876)+635.549954735572×(t[λ]−0.0275193798449612)+0.0952699670513029×((F[deg]−35.062015503876)×(F[deg]−35.062015503876)−226.174448650922)+52.2497839562047×((F[deg]−35.062015503876)×(t[λ]−0.0275193798449612))+(−7899.86645624221)×((t[λ]−0.0275193798449612)×(t[λ]−0.0275193798449612)−0.000207606213568896) Formula(2).

19. An acoustic wave device comprising:
a piezoelectric layer including lithium tantalate or lithium niobate;
a dielectric film located on the piezoelectric layer and including a dielectric material with a higher dielectric constant than that of the lithium tantalate or lithium niobate; and
an IDT electrode on the dielectric film; wherein
when the dielectric film includes $CaTiO_3$ and a wavelength determined by an electrode finger pitch of the IDT electrode is defined as λ, when a thickness of the dielectric film normalized with λ is defined as t [λ], the piezoelectric layer includes $LiTaO_3$, a cut-angle of the $LiTaO_3$ is defined as F [deg], and a thickness of the $LiTaO_3$ normalized with λ is defined as t_LT [λ], Formula (3) is satisfied:

−80[deg]≥(−28.1519168710076)+16.3927771813082×(t[λ]−0.0274514038876891)+1.451571123731×(F[deg]−44.9730021598272)+190.76171323928×(t_LT[λ]−0.199892008639309)+(−1630.52997244197)×((t[λ]−0.0274514038876891)×(t[λ]−0.0274514038876891)−0.000206787595221326)+11.7270198827755×((t[λ]−0.0274514038876891)×(F[deg]−44.9730021598272))+0.0325641412336404×((F[deg]−44.9730021598272)×(F[deg]−44.9730021598272)−749.486312153343)+(−2760.19968889668)×((t[λ]−0.0274514038876891)×(t_LT[λ]−0.199892008639309))+1.50835034999896×((F[deg]−44.9730021598272)×(t_LT[λ]−0.199892008639309))+(−983.831618195462)×((t_LT[λ]−0.199892008639309)×(t_LT[λ]−0.199892008639309)−0.00124998833786601) Formula(3).

* * * * *